(12) United States Patent
Herner

(10) Patent No.: US 11,968,837 B2
(45) Date of Patent: Apr. 23, 2024

(54) STAGGERED WORD LINE ARCHITECTURE FOR REDUCED DISTURB IN 3-DIMENSIONAL NOR MEMORY ARRAYS

(71) Applicant: SUNRISE MEMORY CORPORATION, San Jose, CA (US)

(72) Inventor: Scott Brad Herner, Portland, OR (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

(21) Appl. No.: 18/049,979

(22) Filed: Oct. 26, 2022

(65) Prior Publication Data

US 2023/0082546 A1 Mar. 16, 2023

Related U.S. Application Data

(63) Continuation of application No. 17/221,677, filed on Apr. 2, 2021, now Pat. No. 11,515,328, which is a continuation of application No. 16/920,603, filed on Jul. 3, 2020, now Pat. No. 11,011,544, which is a continuation of application No. 16/530,842, filed on Aug. 2, 2019, now Pat. No. 10,741,582, which is a continuation of application No. 16/113,296, filed on Aug. 27, 2018, now Pat. No. 10,431,596.

(60) Provisional application No. 62/551,110, filed on Aug. 28, 2017.

(51) Int. Cl.
*H10B 43/27* (2023.01)
*H01L 29/08* (2006.01)
*H01L 29/792* (2006.01)
*H10B 43/20* (2023.01)
*H10B 43/30* (2023.01)

(52) U.S. Cl.
CPC .......... *H10B 43/27* (2023.02); *H01L 29/0847* (2013.01); *H10B 43/20* (2023.02); *H10B 43/30* (2023.02); *H01L 29/7923* (2013.01)

(58) Field of Classification Search
CPC ......... H01L 27/11582; H01L 27/11568; H01L 27/11578; H01L 29/0847; H01L 29/7923; H01L 27/11565; G11C 5/063; G11C 16/08
See application file for complete search history.

(56) References Cited

U.S. PATENT DOCUMENTS

| | | | |
|---|---|---|---|
| 6,466,471 B1 | 10/2002 | Bhattacharyya | |
| 8,148,763 B2 | 4/2012 | Kim et al. | |
| 8,644,046 B2 | 2/2014 | Seol et al. | |
| 8,699,293 B2 | 4/2014 | Yan et al. | |
| 8,982,621 B2 | 3/2015 | Choi | |

(Continued)

FOREIGN PATENT DOCUMENTS

CN 105448922 A 3/2016

*Primary Examiner* — Earl N Taylor
(74) *Attorney, Agent, or Firm* — Edward C. Kwok; VLP Law Group LLP

(57) ABSTRACT

A staggered memory cell architecture staggers memory cells on opposite sides of a shared bit line preserves memory cell density, while increasing the distance between such memory cells, thereby reducing the possibility of a disturb. In one implementation, the memory cells along a first side of a shared bit line are connected to a set of global word lines provided underneath the memory structure, while the memory cells on the other side of the shared bit line—which are staggered relative to the memory cells on the first side—are connected to global word lines above the memory structure.

33 Claims, 5 Drawing Sheets

(56) References Cited

U.S. PATENT DOCUMENTS

| | | | |
|---|---|---|---|
| 9,281,044 B2* | 3/2016 | Ramaswamy | H01L 29/78391 |
| 9,620,512 B1 | 4/2017 | Nishikawa et al. | |
| 9,799,406 B2 | 10/2017 | Sato et al. | |
| 9,892,800 B2* | 2/2018 | Harari | G11C 11/5635 |
| 9,972,370 B2 | 5/2018 | Lee | |
| 10,121,553 B2* | 11/2018 | Harari | H01L 29/7926 |
| 10,121,554 B2* | 11/2018 | Harari | H01L 29/66833 |
| 11,515,328 B2* | 11/2022 | Herner | H10B 43/27 |
| 2006/0115978 A1 | 6/2006 | Speckt et al. | |
| 2012/0081958 A1 | 4/2012 | Lee et al. | |
| 2012/0147650 A1 | 6/2012 | Samachisa et al. | |
| 2013/0043455 A1* | 2/2013 | Bateman | H10N 70/8833 257/5 |
| 2014/0340952 A1* | 11/2014 | Ramaswamy | H01L 29/78391 257/295 |
| 2016/0086970 A1* | 3/2016 | Peng | H10B 43/10 257/324 |
| 2017/0092370 A1* | 3/2017 | Harari | H10B 43/40 |
| 2017/0092371 A1* | 3/2017 | Harari | H01L 29/66833 |
| 2017/0207221 A1 | 7/2017 | Kim et al. | |
| 2017/0358599 A1* | 12/2017 | Ramaswamy | H10B 51/20 |
| 2017/0358999 A1 | 12/2017 | Geske et al. | |
| 2018/0090219 A1* | 3/2018 | Harari | G11C 11/5635 |
| 2018/0108423 A1* | 4/2018 | Harari | G11C 11/5635 |
| 2018/0350832 A1* | 12/2018 | Barbato | H10B 43/35 |
| 2018/0366489 A1* | 12/2018 | Harari | H10B 43/27 |
| 2019/0006014 A1* | 1/2019 | Harari | G11C 16/0483 |
| 2019/0006015 A1* | 1/2019 | Norman | G11C 16/10 |
| 2019/0067327 A1* | 2/2019 | Herner | H10B 43/30 |
| 2020/0335519 A1* | 10/2020 | Herner | H01L 29/0847 |

* cited by examiner

STAGGERED WORD LINE ARCHITECTURE FOR REDUCED DISTURB IN 3-DIMENSIONAL NOR MEMORY ARRAYS

CROSS REFERENCES TO RELATED APPLICATIONS

This application is a continuation application of U.S. patent application ("Parent Application"), Ser. No. 17/221,677, entitled "Staggered Word Line Architecture for Reduced Disturb in 3-Dimensional NOR Memory Arrays," filed on Apr. 2, 2021, which is a continuation application of U.S. patent application Ser. No. 16/920,603, entitled "Staggered Word Line Architecture for Reduced Disturb in 3-Dimensional NOR Memory Arrays," filed on Jul. 3, 2020, which is a continuation application of U.S. patent application Ser. No. 16/530,842, entitled "Staggered Word Line Architecture for Reduced Disturb in 3-Dimensional NOR Memory Arrays," filed on Aug. 2, 2019, which is a continuation application of U.S. patent application Ser. No. 16/113,296, entitled "Staggered Word Line Architecture for Reduced Disturb in 3-Dimensional NOR Memory Arrays," filed on Aug. 27, 2018, which claims priority of U.S. provisional patent application ("Parent Provisional Application"), Ser. No. 62/551,110, entitled "Staggered Word Line Architecture for Reduced Disturb in 3-Dimensional NOR Memory Arrays," filed on Aug. 28, 2017.

This application is related to U.S. patent application ("Non-provisional application"), Ser. No. 15/248,420, entitled "Capacitive-Coupled Non-Volatile Thin-film Transistor Strings in Three-Dimensional Arrays," filed Aug. 26, 2016. The Non-provisional application is hereby incorporated by reference in its entirety. The Non-provisional application has been published as U.S. 2017/0092371. References to the Non-provisional application herein are made by paragraph numbers of the publication. The present application is also related to (i) U.S. provisional application ("Provisional Application I"), Ser. No. 62/522,666, entitled "Replacement Metal and Strut for 3D memory Array," filed on Jun. 20, 2017: U.S. provisional application ("Provisional Application II"), Ser. No. 62/522,661, entitled "3-Dimensional NOR String Arrays in Segmented Stacks," filed on Jun. 20, 2017; and (iii) U.S. provisional application ("Provisional Application III"), Ser. No. 62/522,665, entitled "3-Dimensional NOR String Arrays in Segmented Shared Store Regions," filed on Jun. 20, 2017. The Parent Application, the Parent Provisional Application, the Non-Provisional application, and the Provisional Applications I, II and III are hereby incorporated by reference in their entireties.

BACKGROUND OF THE INVENTION

1. Field of the Invention

The present invention relates to non-volatile NOR-type memory strings. In particular, the present invention relates to an architecture for the 3-dimensional memory array.

2. Discussion of the Related Art

In high density three-dimensional memory structures, such as those disclosed in the Non-provisional application, it is desirable to keep memory cells separated from each other by at least a certain distance in order to avoid the effects of fringing fields resulting from charge in one memory cell from interfering with the charge storage in the other memory cell, while maintaining the desirable high density. In the prior art, such as illustrated by FIGS. 1a and 1b, a NOR-type memory array includes memory cells 1 and 2 which share a single bit line 108. As shown in FIG. 1a, cells 1 and 2 are provided charge storage layers 107 and gate electrodes 109 ("local word lines") on opposite sides of shared bit line 108 directly across from each other. The charge storage layers 107 of memory cells 1 and 2 are separated by less than the width of their shared bit line 108. However, with decreasing feature sizes, memory cells 1 and 2 are in close enough proximity that each memory cell may disturb the other memory cell during program, erase, or read operations.

FIG. 1b shows a completed memory structure 100 having word lines that are aligned in the manner illustrated in FIG. 1a. As shown in FIG. 1b, three-dimensional memory structure 100 includes a regular array of memory cells, each illustrated by memory cell 120. (Memory cell 120 shows in three dimensions each of cells 1 and 2.) In FIG. 1b, memory cell 120 includes channel region 112, which is provided between source region 110, drain region or bit line 108. In addition, memory cell 120 includes (i) charge-trapping material 107 provided between word line 109 and channel region 112, and (ii) conductor layer 113, provided adjacent and in contact with drain region or bit line 108, for reducing resistivity in drain region or bit line 108. The memory cells in each column of memory structure 100 are isolated from each other by dielectric layer 114.

FIG. 1c reproduces FIG. 9b of U.S. Patent Application Publication 2016/0086970 to Peng, in which word lines formed above a memory structure ("global word lines") are provided in a staggered fashion to adjacent bit lines (i.e., the staggered local word lines serve different bit lines), but not relative to a single shared bit line. In other words, adjacent global word lines Such an arrangement does not decrease the distance between the nearest memory cells. These approaches also sacrifice memory array density.

SUMMARY

The present invention avoids the potential for disturbs between memory cells in close proximity without sacrificing memory cell density. According to one embodiment of the present invention, a staggered memory cell architecture staggers memory cells on opposite sides of a shared bit line preserves memory cell density, while increasing the distance between such memory cells, thereby reducing the possibility of a disturb. The memory cells along a first side of a shared bit line are connected to a set of global word lines provided underneath the memory structure, while the memory cells on the other side of the shared bit line—which are staggered relative to the memory cells on the first side—are connected to global word lines above the memory structure.

The present invention is better understood upon consideration of the detailed description below, in conjunction with the accompanying drawings.

BRIEF DESCRIPTION OF THE DRAWINGS

FIG. 1b shows completed three-dimensional memory structure 100 having word lines 109 that are aligned, in the manner illustrated in FIG. 1a.

FIG. 2b shows completed three-dimensional memory structure 200 of the current invention having word lines that are staggered, in the manner illustrated in FIG. 2a.

To facilitate cross-reference among the figures and to simplify the detailed description below, like elements in the figures are assigned like reference numerals.

DETAILED DESCRIPTION OF THE PREFERRED EMBODIMENTS

Figure 2A:
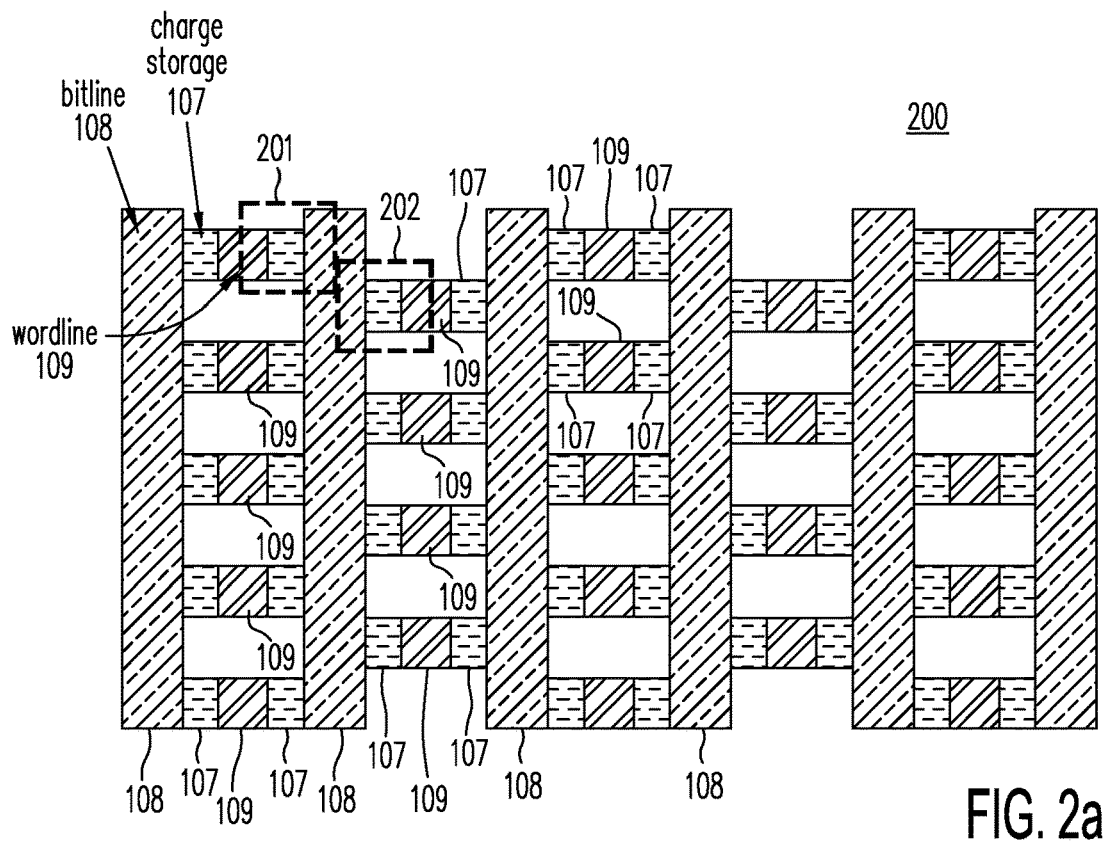
FIG. 2a show memory cells 201 and 202 of memory structure 200 on opposite sides of shared bit line 108 being offset or "staggered" in position relative to each other, according to one embodiment of the present invention.

FIG. 2a show memory cells 201 and 202 of memory structure 200 on opposite side of shared bit line 108 being offset or "staggered" in position relative to each other, according to one embodiment of the present invention.

Figure 1A:
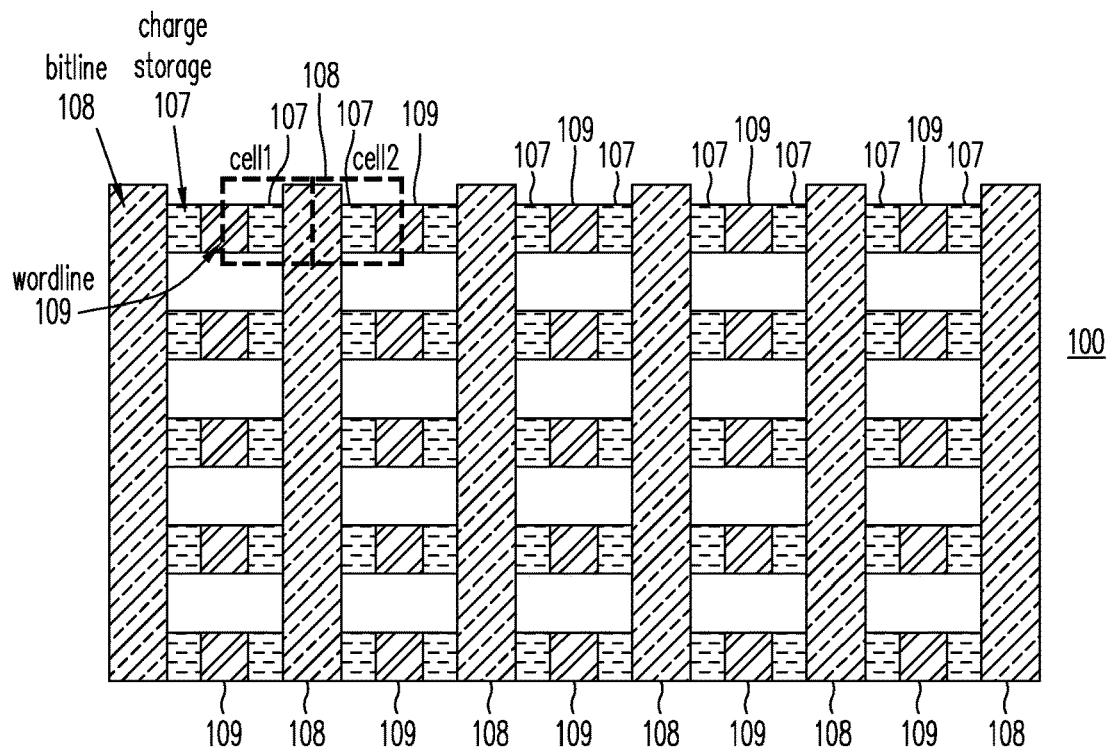
FIG. 1a shows in a top plan view a NOR-type memory array in memory structure 100, with memory cells 1 and 2 sharing single bit line 108.
Figure 1B:
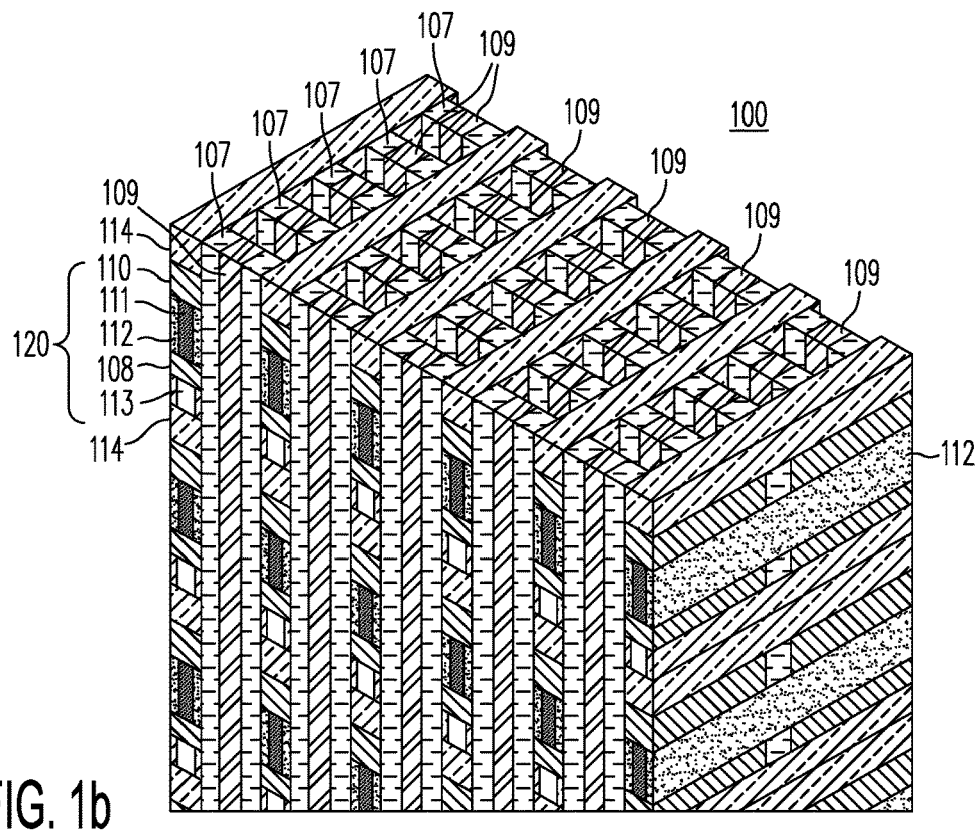
Figure 1C:
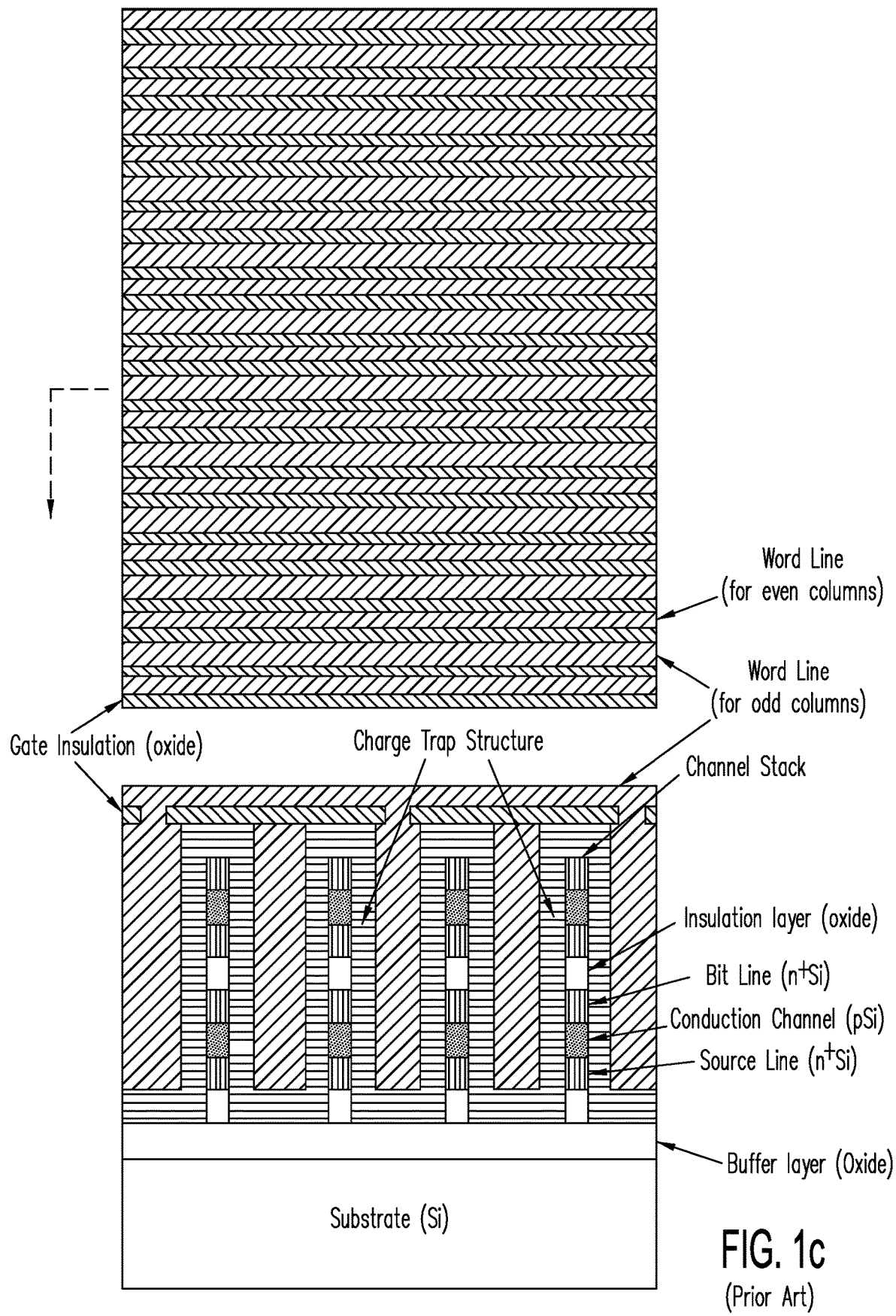
FIG. 1c shows a prior art NOR-type memory structure with alternate word lines atop the array positioned side by side staggered between odd columns and even columns (reproduced from FIG. 9b of U.S. Patent Application Publication 2016/0086970 to Peng)
Figure 2B:
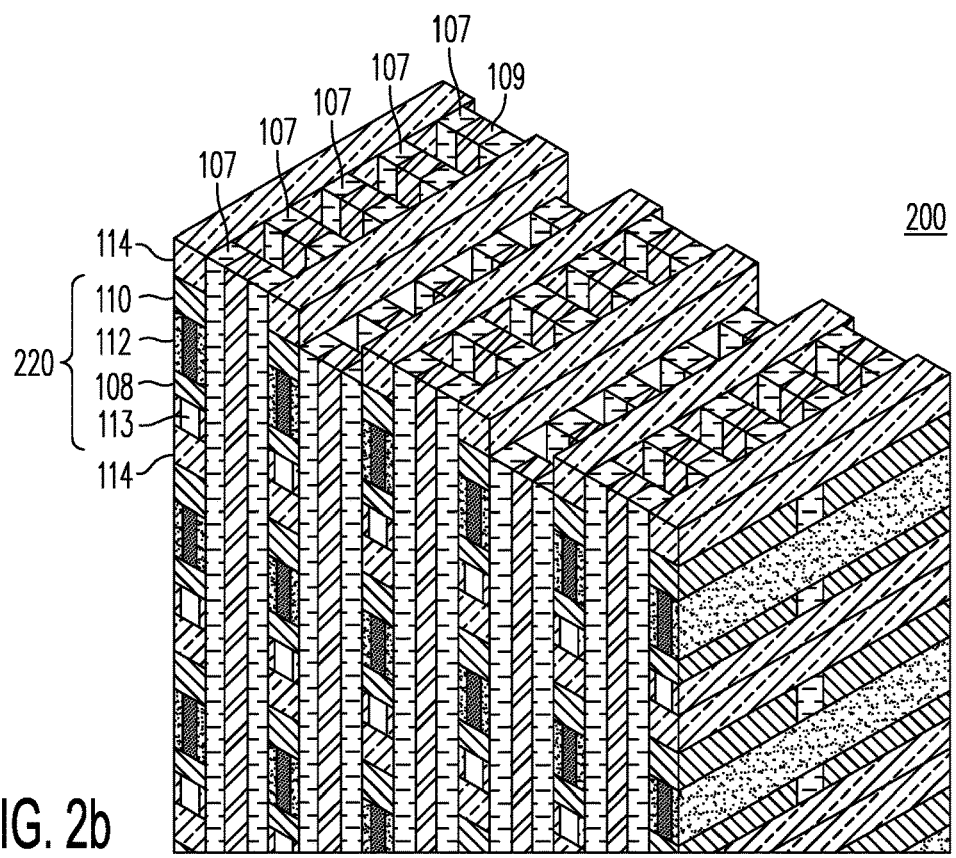

FIG. 2b shows completed memory structure 200 having staggered word lines in the manner illustrated in FIG. 2a. As in memory structure 100 of FIG. 1a, FIG. 1b shows completed memory structure 200 having word lines that are aligned in the manner illustrated in FIG. 2a. As shown in FIG. 2b, three-dimensional memory structure 200 includes a regular array of memory cells, each illustrated by memory cell 220. (Memory cell 220 shows in three dimensions each of memory cells 201 and 202.) In FIG. 2b, memory cell 220 includes channel region 112, which is provided between source region 110, drain region or bit line 108. In addition, memory cell 220 includes (i) charge-trapping material 107 provided between word line 109 and channel region 112, and (ii) conductor layer 113, provided adjacent and in contact with drain region or bit line 108, for reducing resistivity in drain region or bit line 108. The memory cells in each column of memory structure 200 are isolated from each other by dielectric layer 114.

Unlike the directly across arrangement for the nearest memory cells of FIGS. 1a and 1b, memory structure 200 of FIGS. 2a and 2b has the word lines 109 of its nearest memory cells on opposite sides of shared bit line 108 offset or staggered relative to each other. The offset is maintained over the entire length of bit line 108. As any pair of nearest memory cells on opposite sides of shared bit line 108 are now offset to each other, unlike the directly across arrangement for the nearest memory cells shown in FIG. 1a, the net result is a considerable increase in the nearest distance between the charge storage layers in these memory cells, as compared to memory cells in the aligned word line case of FIG. 1a. The increase in the nearest distance help reduce program disturb between the nearest memory cells.

Figure 3A:
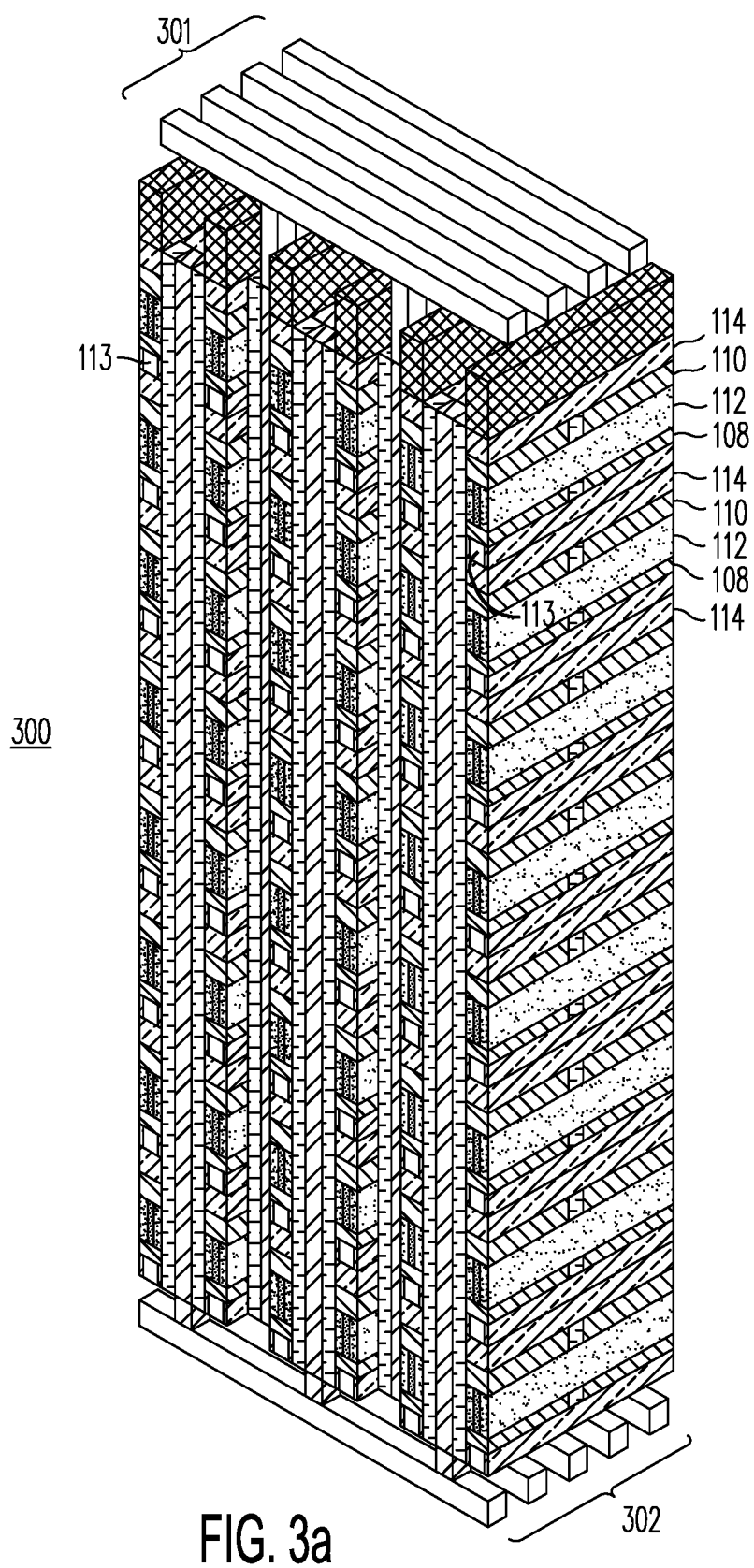
FIG. 3a shows memory structure 300 having interconnects ("global word lines") routing signals above and below the memory structure, that run parallel to, but offset to be staggered relative to, each other.
Figure 3B:
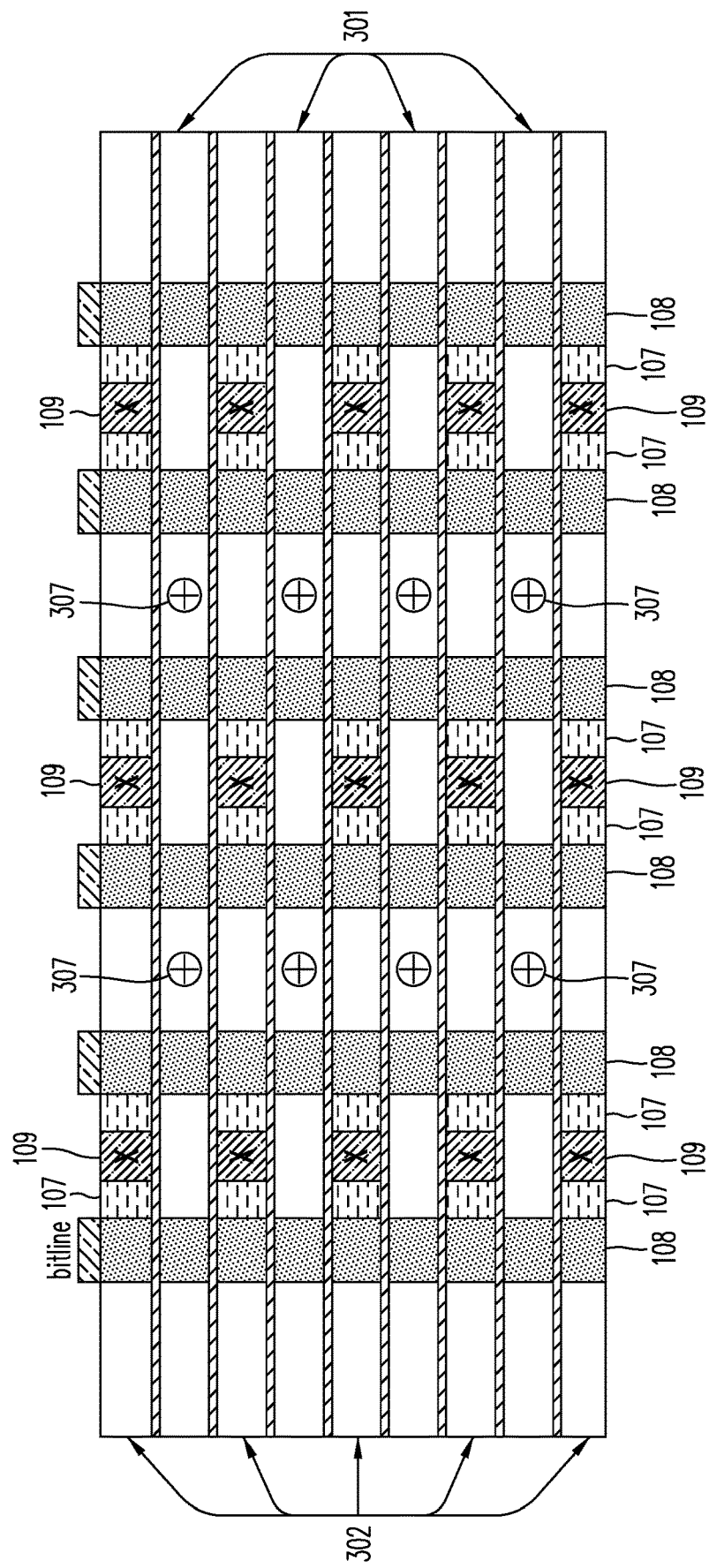
FIG. 3b shows, in plan view, the conductors of the top global word lines are offset from the parallel conductors of the bottom global word lines by approximately one half-pitch.

The connections of word lines to global interconnects can be accomplished by any of several approaches. FIG. 3a shows memory structure 300 having interconnects layers ("global word lines") 301 and 302 routing signals above and below a memory array (referred to as "top global word lines" 301 and "bottom global word lines" 302, respectively). The memory array in memory structure 300, for example, may be the memory array in memory structure 200 of FIG. 2b. In FIG. 3a, the conductors of top global word lines 301 and bottom global word lines 302 may run parallel to each other, having substantially the same conductor spacing. FIG. 3b shows one arrangement in which the conductors of the global word lines 301 and 302 are offset from each other by approximately one half-pitch, as shown in a top plan view. FIG. 3b shows also the positions of shared bit lines 108, showing that no additional silicon area is required to achieve the dense memory arrays with staggered word lines.

Under this arrangement, as shown in FIG. 3b, local word lines 109 on one side of shared bit line 108 can contact directly bottom global word lines 302 (via positions marked by "X"), while local word lines 109 on the opposite side of their shard bit line 108 can contact directly top global word lines 301 (via positions 307 marked by "⊕"). In this manner, the highest memory cell density is achieved while at the same time also having considerably reduced the parasitic interference between the staggered (e.g., memory cells 201 and 202 of FIG. 2a).

The adverse impact of cell-to-cell interference is illustrated by the following example on memory cells 1 and 2 of FIG. 1a: Assume adjacent memory cells 1 and 2 are initially in their erased state. Memory cell 1 is next programmed to its desired threshold voltage $V_{pg1}$. However, when memory cell 2 is subsequently also programmed to its desired threshold voltage $V_{pg2}$, the threshold voltage of memory cell 1 may be shifted from its previous programmed threshold voltage $V_{pg1}$. The amount of threshold voltage shift in memory cell 1 depends on the parasitic coupling between memory cells 1 and 2. Relative to back-to-back memory cells (e.g., memory cells 1 and 2 of FIG. 1a), staggered memory cells of the present invention (e.g., memory cells 201 and 202 of FIG. 2a) have considerably reduced parasitic coupling. The undesirable cell-to-cell interference is particularly problematic when the memory cells store more than one binary bit of information under a multilevel cell (MLC) mode of operation, where each memory cell may be programmed to any one of several threshold voltages. The required voltage separation between the threshold voltages is correspondingly smaller, relative to the single-binary bit mode of operation. Staggering memory cells 201 and 202 of FIG. 2a relative to each other substantially reduces such interference, thereby making MLC a viable operating mode.

The detailed description above is provided to illustrate specific embodiments of the present invention and is not intended to be limiting. Various modifications and variations within the scope of the present invention are possible. The present invention is set forth in the accompanying claims.

I claim:

1. A memory structure comprising a plurality of NOR memory strings form above a planar surface of a substrate, wherein each NOR memory string comprises a plurality of memory cells sharing a common bit line and a common source line, wherein (i) each memory cell is associated with a gate electrode, (ii) the common bit line extends lengthwise along a first direction substantially parallel the planar surface, (iii) a first group of the memory cells are formed along a first side of the common bit line and (iv) a second group of the memory cells are formed along a second side of the common bit line opposite the first side, and (v) the gate electrodes of the memory cells on the first side and the gate electrodes of the memory cells on the second side are provided in a staggered configuration.

2. The memory structure of claim 1, wherein the plurality of NOR memory strings form an array extending along a second direction and along a third direction, wherein (i) the second direction is substantially parallel to the planar surface and orthogonal to the first direction and (ii) the third is substantially normal to the planar surface.

3. The memory structure of claim 2, wherein NOR memory strings with the array that are aligned along the third direction include memory cells that are associated with the same gate electrode.

4. The memory structure of claim 1, wherein the common bit line and the common source line in each NOR memory string are formed out of first and second conductive layers, respectively.

5. The memory structure of claim 4, wherein the first and second conductive layers are separated from each other by a substantially uniform distance along the third direction.

6. The memory structure of claim 4, wherein the channel regions of the memory cells of each NOR memory string are formed out of a semiconductor layer of a first conductivity type.

7. The memory structure of claim 5, wherein the first and second conductive layers each comprise a semiconductor material of a second conductivity type opposite the first conductivity type.

8. The memory structure of claim 1, wherein the gate electrodes associated with the memory cells of a NOR memory string on the first side and the gate electrodes associated with the memory cells of the NOR memory string on the second side form first and second rows of conductors, respectively, the first row and the second row each extending substantially along the first direction.

9. The memory structure of claim 1, further comprising an interconnection network having conductors that are each in electrical contact with one of the gate electrodes.

10. The memory structure of claim 9, wherein the conductors of the interconnection network each extend lengthwise along the second horizontal direction.

11. The memory structure of claim 10, wherein a first portion of the conductors of the interconnection network are provided above the NOR memory strings.

12. The memory structure of claim 10, wherein a second portion of the conductors in the interconnection network are provided below the NOR memory strings.

13. The memory structure of claim 9, wherein circuitry is formed in or on the substrate, and wherein the conductors of the interconnection network and the common bit lines of the NOR memory strings are electrically connected to the circuitry.

14. The memory structure of claim 13, wherein the common source line of each memory string is isolated from the circuitry except when it is pre-charged to a predetermined voltage through the common bit line.

15. The memory structure of claim 1, wherein the gate electrodes each comprise polysilicon.

16. The memory structure of claim 1, wherein each memory cell stores more than one bit of information.

17. A NOR memory string, comprising:
a bit line having a length that extends along a first direction;
a source line, and
a plurality of memory cells formed along a first side and a second side of the bit line, the first and the second sides of the bit line being opposite each other along the length of the bit line, each memory cell comprising (i) a channel region adjacent to both the bit line and the source line; and (ii) a gate electrode having a length extending along a second direction substantially orthogonal to the first direction;
wherein (i) the gate electrodes of the memory cells along the first side of the bit line and the gate electrodes of the memory cells along the second side of the bit line are provided in a staggered configuration; and (ii) the first conductive layer and the second conductive layer are separated from each other substantially uniformly by a distance along the first direction.

18. The NOR memory string of claim 17, wherein the channel region comprises a semiconductor material of a first conductivity type.

19. The NOR memory string of claim 18, wherein the bit line and the source line comprise a first conductive layer and a second conductive layer, respectively.

20. The NOR memory string of claim 19, wherein the first and the second conductive layers each comprise a semiconductor material of a second conductivity type opposite the first conductivity type.

21. The array of NOR memory strings of claim 17, wherein the gate electrodes of the NOR memory strings each comprise polysilicon.

22. The array of NOR memory strings of claim 17, wherein each memory cell of the NOR memory strings stores more than one bit of information.

23. The NOR memory string of claim 17, further comprising a charge storage region provided between the channel region and the gate electrode.

24. An array of NOR memory strings, wherein each NOR memory string comprises:
a bit line having a length that extends along a first direction;
a source line, and
a plurality of memory cells formed along a first side and a second side of the bit line, the first and the second sides of the bit line being opposite each other along the length of the bit line, each memory cell comprising (i) a channel region adjacent to both the bit line and the source line; and (ii) a gate electrode having a length extending along a second direction substantially orthogonal to the first direction;
wherein (i) the gate electrodes of the memory cells along the first side of the bit line and the gate electrodes of the memory cells along the second side of the bit line are provided in a staggered configuration; (ii) the first conductive layer and the second conductive layer are separated from each other substantially uniformly by a distance along the first direction; and (iii) the array of NOR memory strings is formed above a planar surface of a substrate.

25. The array of NOR memory strings of claim 24, wherein the first direction is substantially normal to the planar surface.

26. The array of NOR memory strings of claim 24, further comprising a plurality of conductors wherein a selected one of the conductors provides both the gate electrode of a selected one of the memory cells in a first one of the NOR memory strings and the gate electrode of a selected one of memory cells in a second one of the NOR memory strings.

27. The array of NOR memory strings of claim 26, wherein the bit line of the first NOR memory string and the bit line of the second NOR memory string both extend lengthwise along the first direction.

28. The array of NOR memory strings of claim 24, further comprising an interconnects network having conductors that are each in electrical contact with one or more of the gate electrodes in the NOR memory strings within the array of NOR memory strings.

29. The array of NOR memory strings of claim 28, wherein the conductors each extend lengthwise along the second horizontal direction.

30. The array of NOR memory strings of claim 29, wherein the conductors are provided above the array of NOR memory strings.

31. The array of NOR memory strings of claim 30, wherein the conductors are provided between the array of NOR memory strings and the planar surface.

32. The array of NOR memory strings of claim 24, wherein the first direction is substantially normal to the planar surface.

33. The array of NOR memory strings of claim 24, wherein each NOR memory string further comprises a charge storage region that is provided between the channel region and the gate electrode.

* * * * *